(12) United States Patent
Hytha et al.

(10) Patent No.: US 11,631,584 B1
(45) Date of Patent: Apr. 18, 2023

(54) METHOD FOR MAKING SEMICONDUCTOR DEVICE WITH SELECTIVE ETCHING OF SUPERLATTICE TO DEFINE ETCH STOP LAYER

(71) Applicant: Atomera Incorporated, Los Gatos, CA (US)

(72) Inventors: Marek Hytha, Brookline, MA (US); Keith Doran Weeks, Chandler, AZ (US); Nyles Wynn Cody, Tempe, AZ (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 17/452,610

(22) Filed: Oct. 28, 2021

(51) Int. Cl.
*H01L 21/02* (2006.01)
*H01L 21/311* (2006.01)

(52) U.S. Cl.
CPC .. *H01L 21/02507* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 4,937,204 A | 6/1990 | Ishibashi et al. | |
| 5,216,262 A | 6/1993 | Tsu | |
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |

(Continued)

FOREIGN PATENT DOCUMENTS

| | | |
|---|---|---|
| GB | 2347520 | 6/2000 |
| JP | 2021002593 | 1/2021 |

(Continued)

OTHER PUBLICATIONS

U.S. Appl. No. 16/801,287, filed Feb. 26, 2020 Weeks et al.

(Continued)

*Primary Examiner* — Roberts P Culbert
(74) *Attorney, Agent, or Firm* — Allen, Dyer, Doppelt, + Gilchrist, P.A.

(57) ABSTRACT

A method for making a semiconductor device may include forming a superlattice above a semiconductor layer. The superlattice may include a plurality of stacked groups of layers, with each group of layers including a plurality of stacked base semiconductor monolayers defining a base semiconductor portion and at least one non-semiconductor monolayer constrained within a crystal lattice of adjacent base semiconductor portions. The method may further include selectively etching the superlattice to remove semiconductor atoms and cause non-semiconductor atoms to accumulate and define an etch stop layer.

20 Claims, 13 Drawing Sheets

(56) References Cited

U.S. PATENT DOCUMENTS

| | | |
|---|---|---|
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,537,870 B2 | 9/2013 | Jikutani et al. |
| 9,099,423 B2 | 8/2015 | Weeks et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,711,598 B2 | 7/2017 | Kavalieros et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 10,879,356 B2 | 12/2020 | Stephenson et al. |
| 10,879,357 B1 | 12/2020 | Burton et al. |
| 10,884,185 B2 | 1/2021 | Stephenson |
| 10,937,868 B2 | 3/2021 | Burton et al. |
| 10,937,888 B2 | 3/2021 | Burton et al. |
| 11,075,078 B1 | 7/2021 | Cody et al. |
| 2003/0034529 A1 | 2/2003 | Fitzgerald et al. |
| 2003/0057416 A1 | 3/2003 | Currie et al. |
| 2005/0279991 A1 | 12/2005 | Mears et al. |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2008/0012004 A1 | 1/2008 | Huang et al. |
| 2008/0258134 A1 | 10/2008 | Mears et al. |
| 2010/0059737 A1 | 3/2010 | Bhuwalka et al. |
| 2011/0215299 A1 | 9/2011 | Rao |
| 2015/0357414 A1 | 12/2015 | Mears |
| 2016/0149023 A1 | 5/2016 | Mears et al. |
| 2016/0351747 A1 | 12/2016 | Forrest et al. |
| 2016/0358773 A1* | 12/2016 | Mears ............... H01L 29/0649 |
| 2017/0236924 A1* | 8/2017 | Balakrishnan ........ H01L 29/735 257/15 |
| 2019/0058059 A1 | 2/2019 | Stephenson et al. |
| 2019/0189652 A1 | 6/2019 | Chen et al. |
| 2019/0319135 A1 | 10/2019 | Stephenson |
| 2019/0319167 A1 | 10/2019 | Stephenson |
| 2020/0135489 A1* | 4/2020 | Weeks ............. H01L 21/02532 |
| 2020/0343367 A1 | 10/2020 | Takeuchi et al. |
| 2020/0343380 A1 | 10/2020 | Takeuchi et al. |
| 2020/0411645 A1 | 12/2020 | Weeks et al. |
| 2021/0020749 A1 | 1/2021 | Burton et al. |
| 2021/0074814 A1 | 3/2021 | Stephenson et al. |
| 2021/0217875 A1 | 7/2021 | Burton |
| 2021/0217880 A1 | 7/2021 | Burton |
| 2021/0265220 A1 | 8/2021 | Lee et al. |

FOREIGN PATENT DOCUMENTS

| | | | |
|---|---|---|---|
| KR | 2013039807 A | * | 4/2013 |
| WO | 2020102283 | | 5/2020 |

OTHER PUBLICATIONS

U.S. Appl. No. 16/801,305, filed Feb. 26, 2020 Weeks et al.
U.S. Appl. No. 16/898,564, filed Jun. 11, 2020 Takeuchi et al.
U.S. Appl. No. 16/898,589, filed Jun. 11, 2020 Takeuchi et al.
U.S. Appl. No. 17/236,289, filed Apr. 21, 2021 Hytha et al.
U.S. Appl. No. 17/236,329, filed Apr. 21, 2021 Hytha et al.

(56) References Cited

OTHER PUBLICATIONS

U.S. Appl. No. 17/305,098, filed Jun. 30, 2021 Weeks et al.
U.S. Appl. No. 17/305,101, filed Jun. 30, 2021 Weeks et al.
U.S. Appl. No. 17/305,192, filed Jul. 1, 2021 Weeks et al.
U.S. Appl. No. 17/330,831, filed May 26, 2021 Hytha et al.
U.S. Appl. No. 17/330,860, filed May 26, 2021 Hytha et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" ysiwyg://1/ http://www3.interscience.wiley.com/cgi-bin/abstract/72512946/ start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pgs. 3345-3349.
Xu et al., "MOSFET performance and scalability enhancement by insertion of oxygen layers", Department of Electrical Engineering and Computer Science, University of California, Berkeley, 2012, pp. 1-4.
https://www.pall.com/content/dam/pall/microelectronics/literature-library/non-gated/HBr_Polysilicon.pdf.
U.S. Appl. No. 17/452,604, filed Oct. 28, 2021 Hytha et al.
Balachova et al., "CF4 plasma etching of materials used in microelectronics manufacturing", Microelectronic Journal, Oct. 1999, pp. 213-215.
Isheden et al., "Mosfe I s with recessed SiGe source/drain junctions formed by selective etching and growth", Electrochemical and Solid-State letters, Jul. 2003, pgs g53-g55.
Saggio et al., "Reactive ion etching characterization of a-SiC:H in CF4/O2 plasma", Materials Science and Engineer B29, 1995, pp. 176-180.
"Wet-Chemical Etching of Silicon", MicroChemicals, www.microchemicals.eu/technical_information, Feb. 2012, pp. 1-3.

* cited by examiner

METHOD FOR MAKING SEMICONDUCTOR DEVICE WITH SELECTIVE ETCHING OF SUPERLATTICE TO DEFINE ETCH STOP LAYER

TECHNICAL FIELD

The present disclosure generally relates to semiconductor devices, and, more particularly, to methods for making semiconductor devices with enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a superlattice above a semiconductor layer. The superlattice may include a plurality of stacked groups of layers, with each group of layers including a plurality of stacked base semiconductor monolayers defining a base semiconductor portion and at least one non-semiconductor monolayer constrained within a crystal lattice of adjacent base semiconductor portions. The method may further include selectively etching the superlattice to remove semiconductor atoms and cause non-semiconductor atoms to accumulate and define an etch stop layer.

In an example embodiment, the method may further include epitaxially growing an active semiconductor layer above the etch stop layer. In another example implementation, the method may include removing the etch stop layer. Furthermore, the method may also include forming at least one other superlattice between the semiconductor layer and the superlattice layer, with the at least one other superlattice including a plurality of stacked groups of layers, and each group of layers including a plurality of stacked base semiconductor monolayers defining a base semiconductor portion and at least one non-semiconductor monolayer constrained within a crystal lattice of adjacent base semiconductor portions.

By way of example, selectively etching may comprise chemical etching or plasma etching. The at least one non-semiconductor monolayer may comprise a non-semiconductor selected from the group consisting of oxygen, nitrogen, fluorine, carbon and carbon-oxygen, for example. Furthermore, the base semiconductor layers may comprise silicon, for example. Also by way of example, the etch stop layer may comprise at least one full monolayer of non-semiconductor atoms.

DETAILED DESCRIPTION

Figure 1:
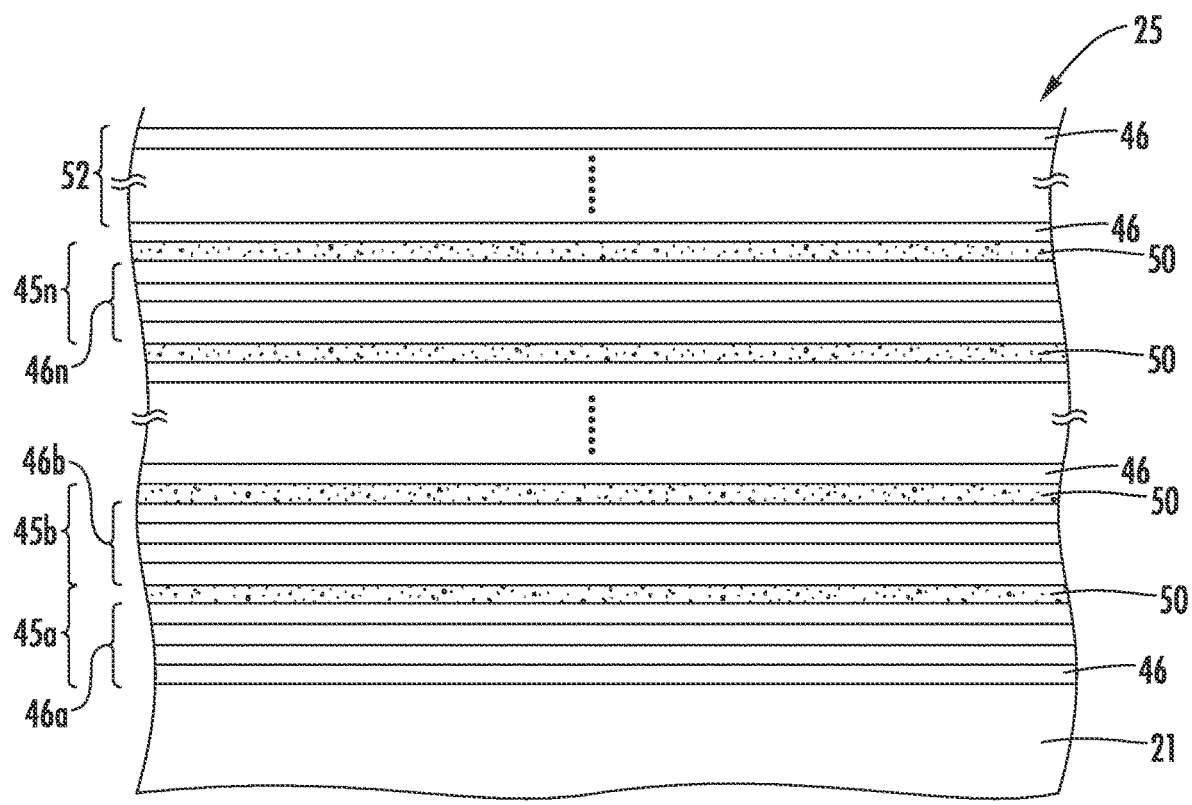
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
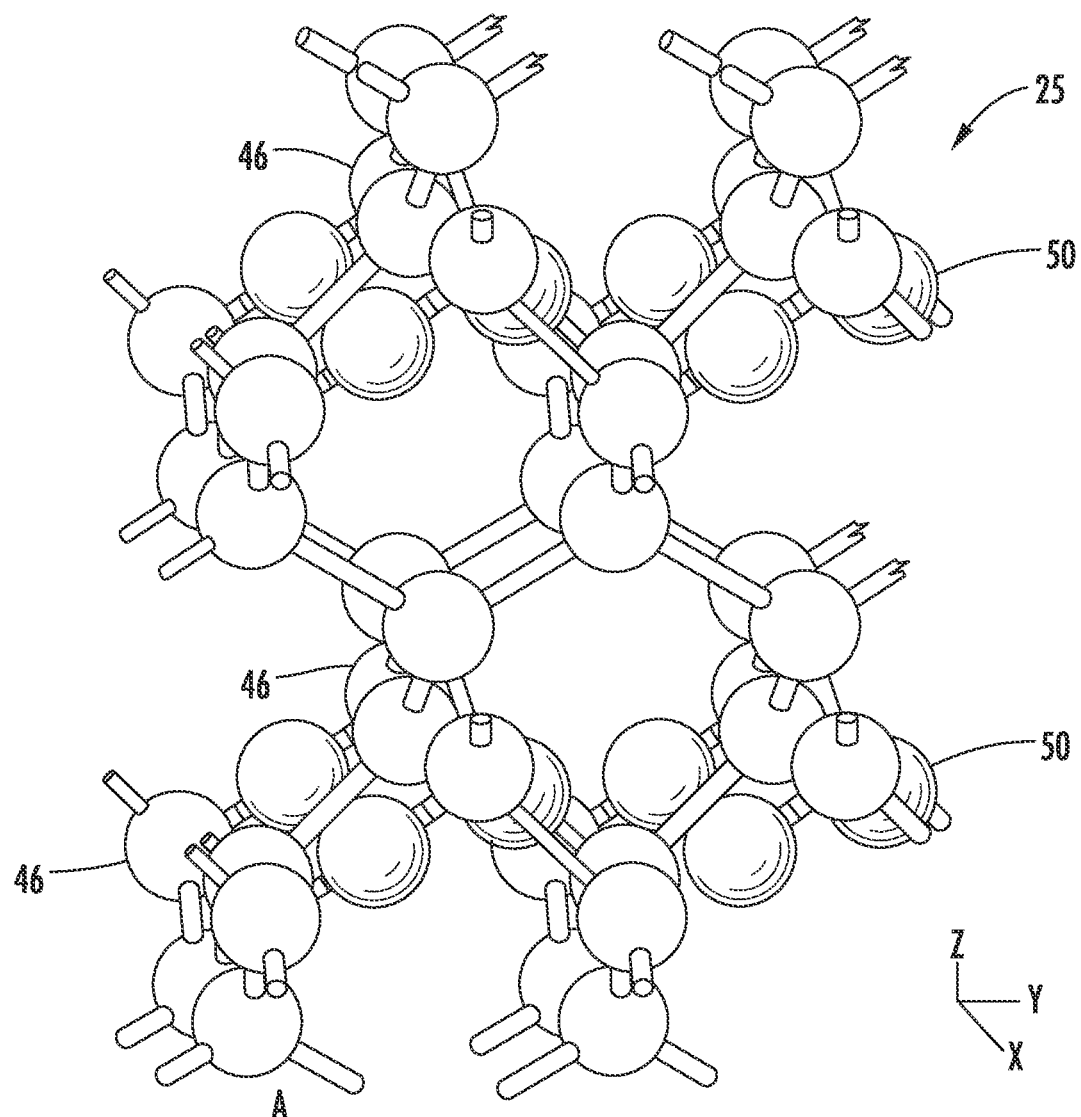
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
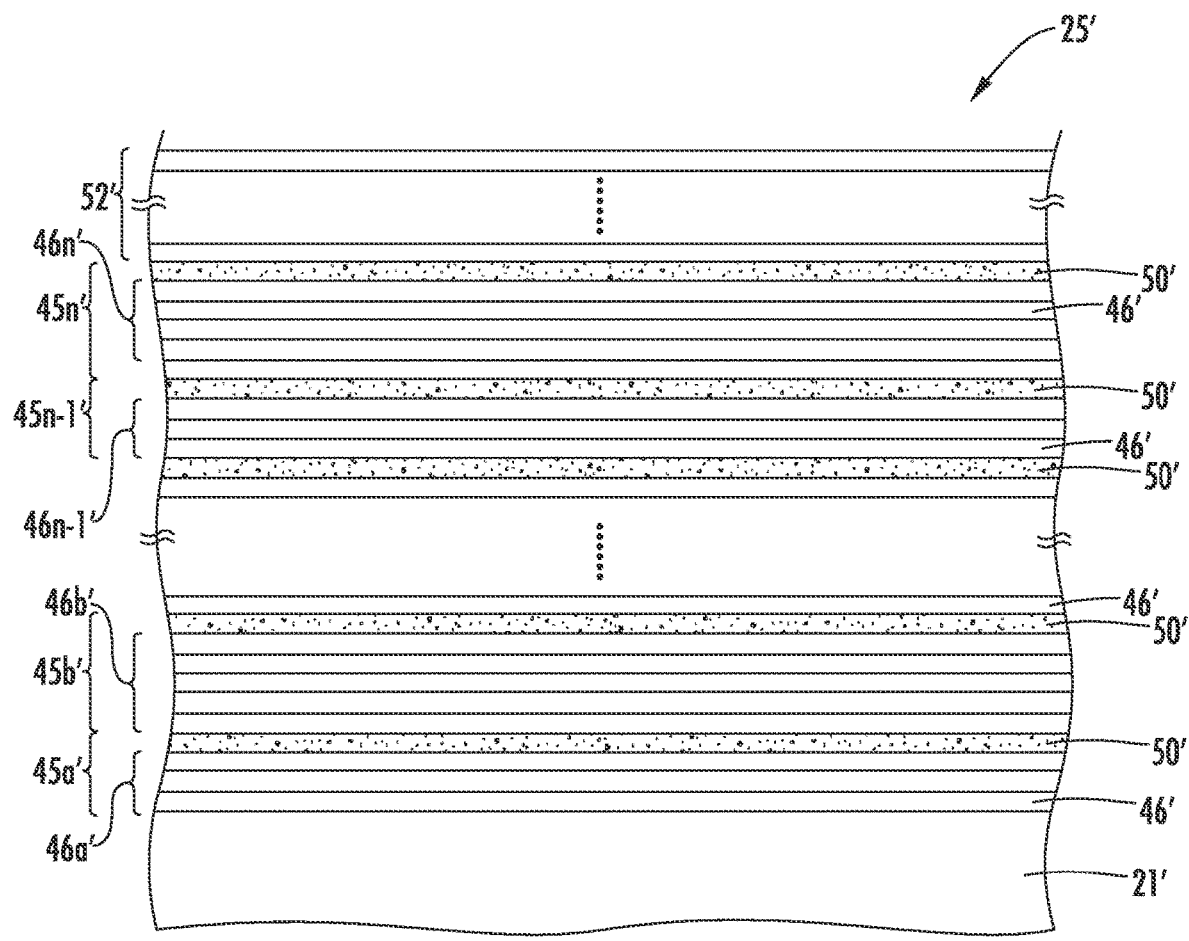
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
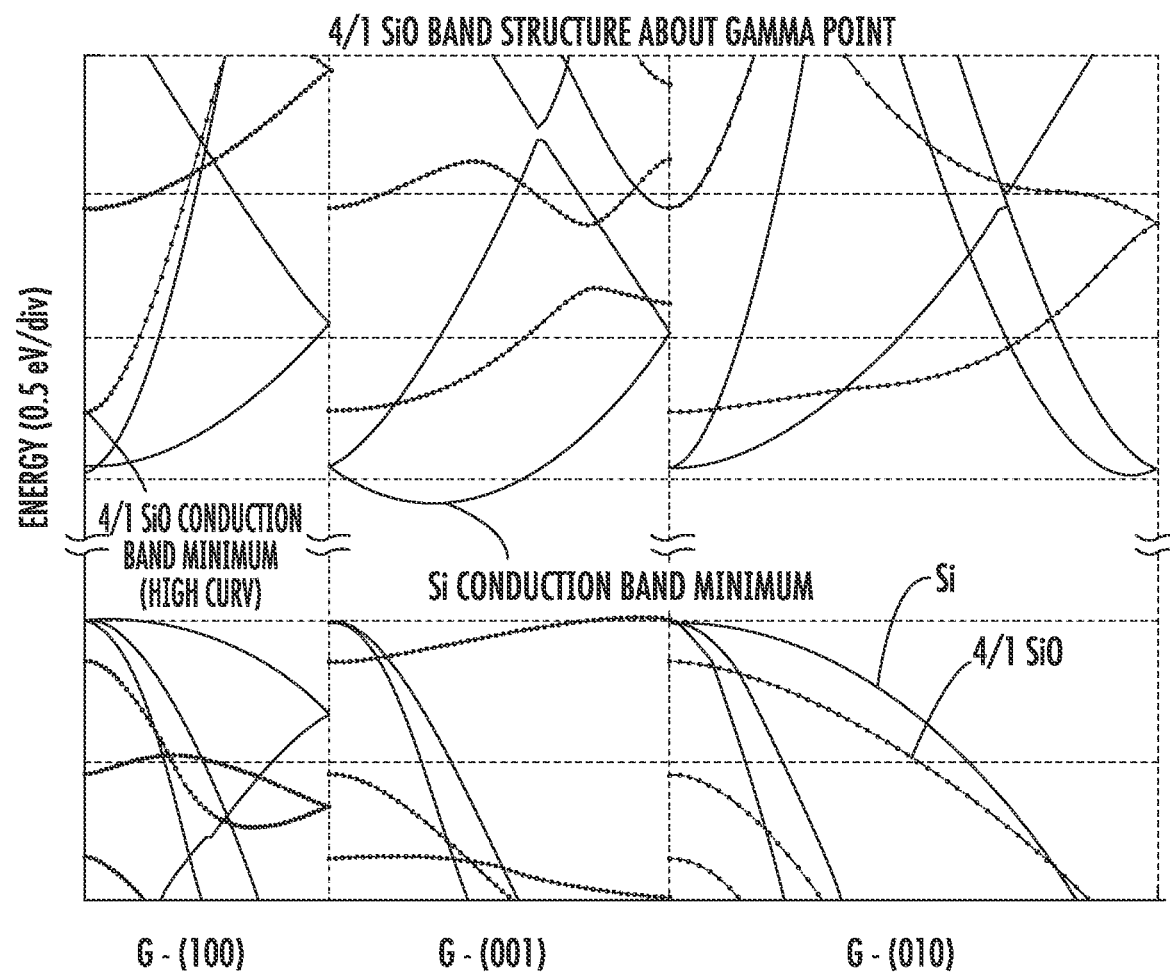
FIG. 4A is a graph of the calculated band structure from the gamma point (G) for both bulk silicon as in the prior art, and for the 4/1 Si/O superlattice as shown in FIGS. 1-2.
Figure 4B:
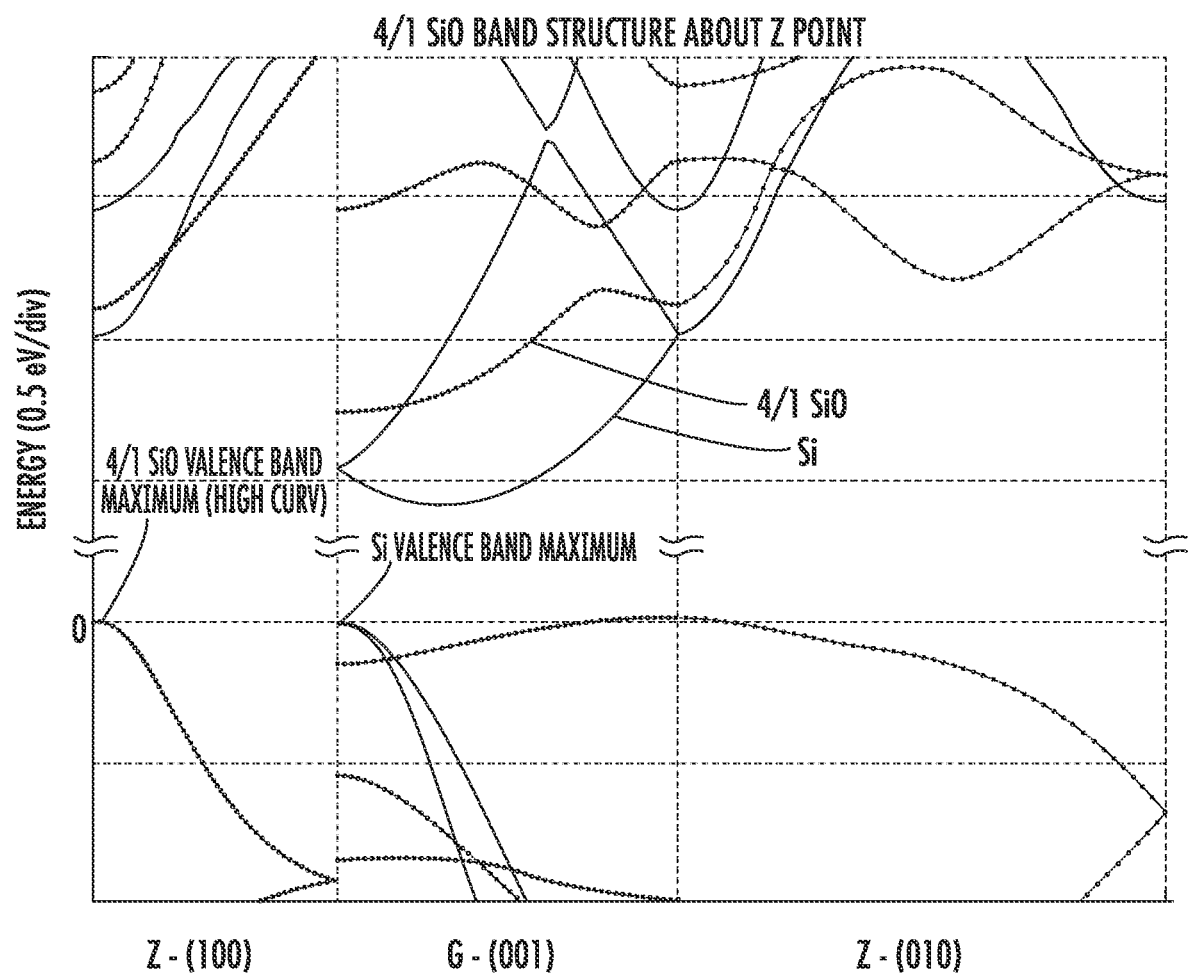
FIG. 4B is a graph of the calculated band structure from the Z point for both bulk silicon as in the prior art, and for the 4/1 Si/O superlattice as shown in FIGS. 1-2.
Figure 4C:
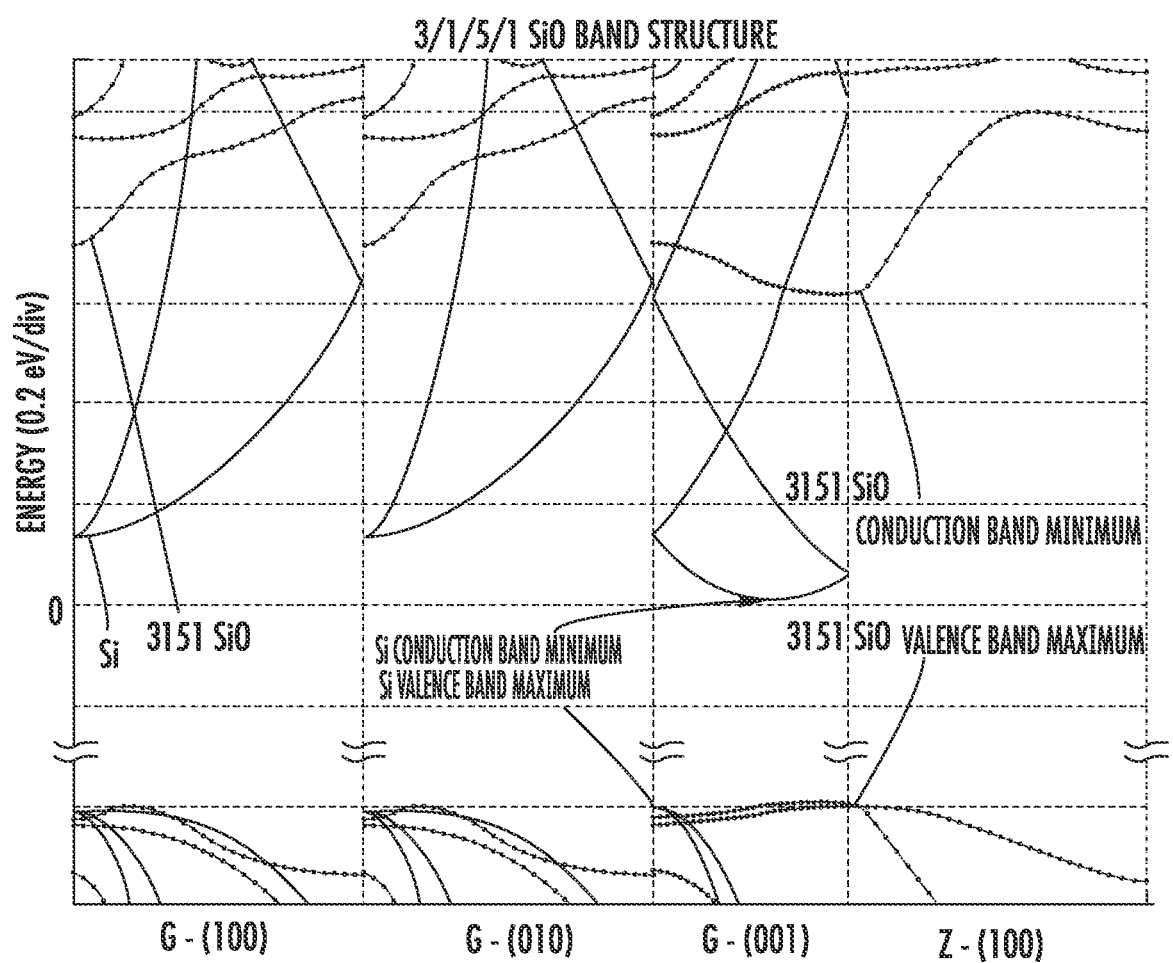
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Using the above-described techniques, advanced semiconductor devices may be fabricated in which one or more MST layers may be selectively etched to accumulate non-semiconductor atoms in the MST layer(s) (e.g., oxygen, carbon, nitrogen, etc.) in a desired location, such as to provide an etch stop layer. This approach may conceptually be considered as "bulldozing" non-semiconductor atoms to a desired location, in that these atoms are pushed/piled up as semiconductor (e.g., silicon) atoms are etched away at a higher rate than then dopants/alloyed atoms.

Figure 5:
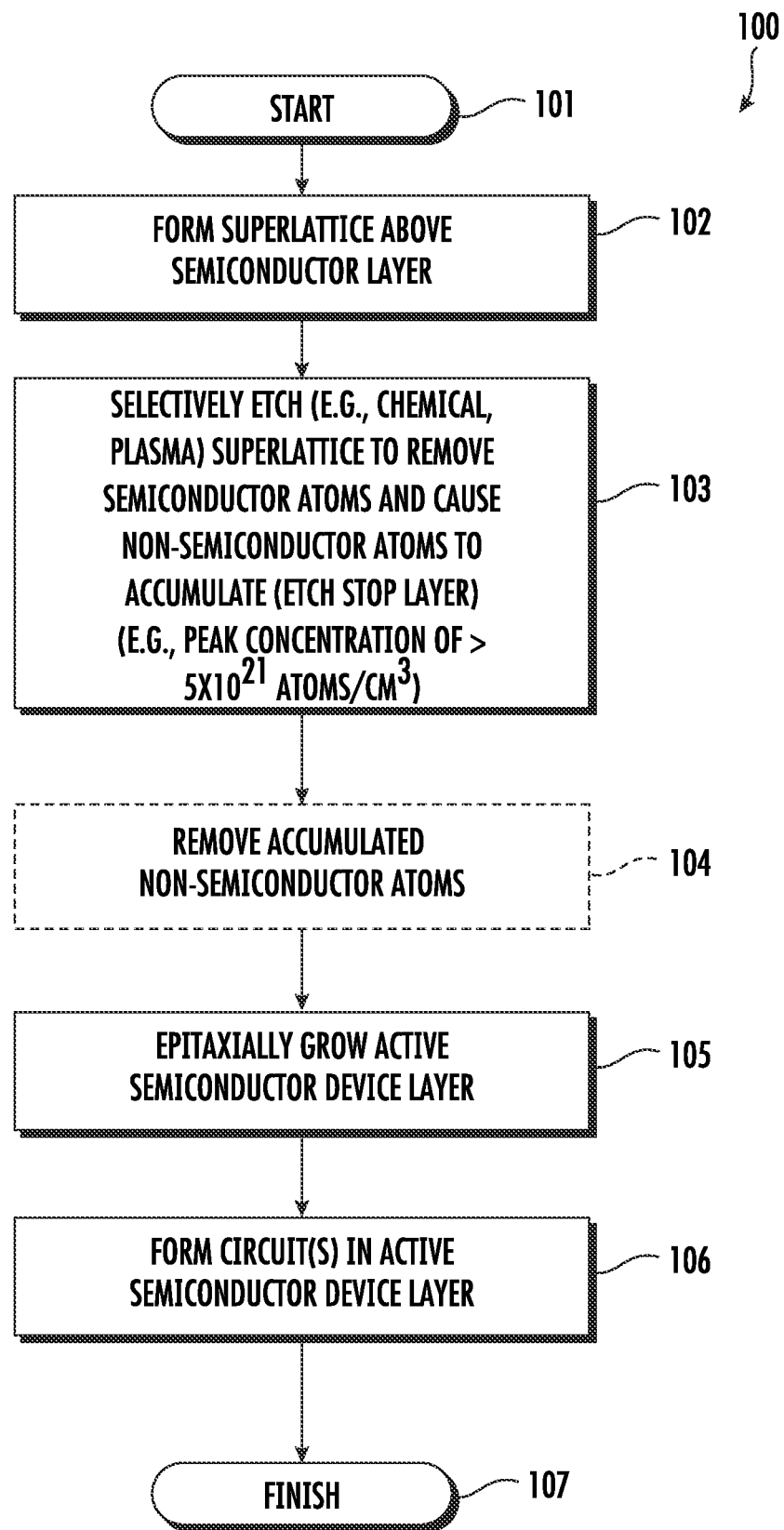
FIG. 5 is a flow diagram illustrating a method for making a semiconductor device involving etching of a superlattice such as those shown in FIGS. 1 and 3 to accumulate non-semiconductor atoms.
Figure 6:
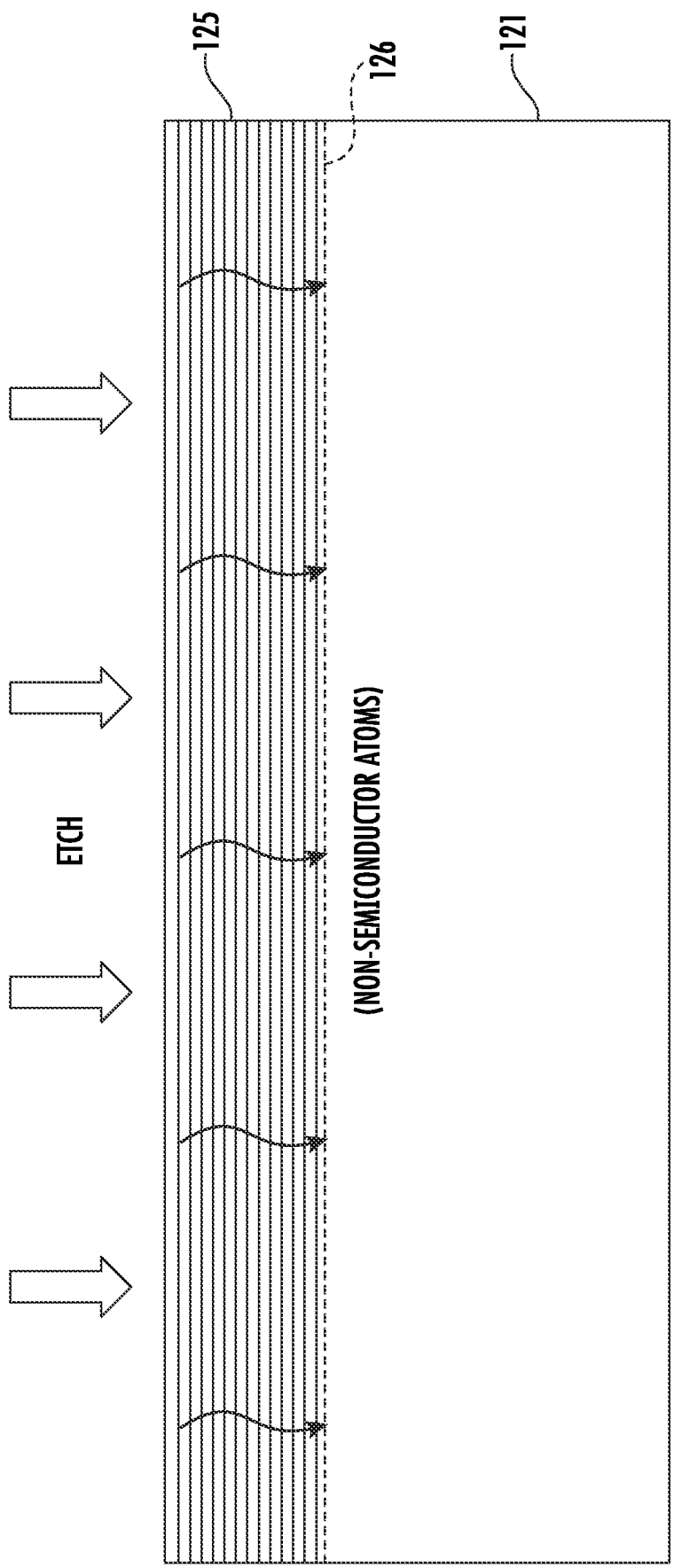
FIG. 6 is a schematic block diagram illustrating the approach of FIG. 5.

Referring initially to the flow diagram 100 of FIG. 5 and FIG. 6, beginning at Block 100, an example approach for forcing non-semiconductor atoms from a superlattice 125 to accumulate in a desired location is first described. The superlattice 125 is formed adjacent or on a semiconductor layer (e.g., substrate) 121, as described above. The superlattice 125 is then selectively etched to remove semiconductor atoms and cause non-semiconductor atoms to accumulate, such as to define an etch stop layer 126, at Block 103. This process is also referred to as "bulldozing" below. The etch stop layer 126 defines the boundary at which semiconductor (e.g., silicon) atom etching stops. By way of example, in the case of an Si/O superlattice 125, the etch stop layer 136 may have an interfacial accumulation of accumulated oxygen atoms which is generally sufficient to stop an HCl etch, which approaches (or exceeds) a full monolayer of coverage, i.e., populating all of the available semiconductor bonds at the interface as discussed further above. However, other etches and corresponding accumulations of non-semiconductor atoms may be used in different embodiments to provide etch stopping (or for insulating purposes), as will be discussed further below. In some cases, the etch stop layer 126 may be defined within the superlattice 125, so that etching removes an upper portion of the superlattice, or it may be beneath the superlattice in the substrate 121 such that the entire superlattice is removed by the etching, as shown in the example of FIG. 6.

Figure 7:
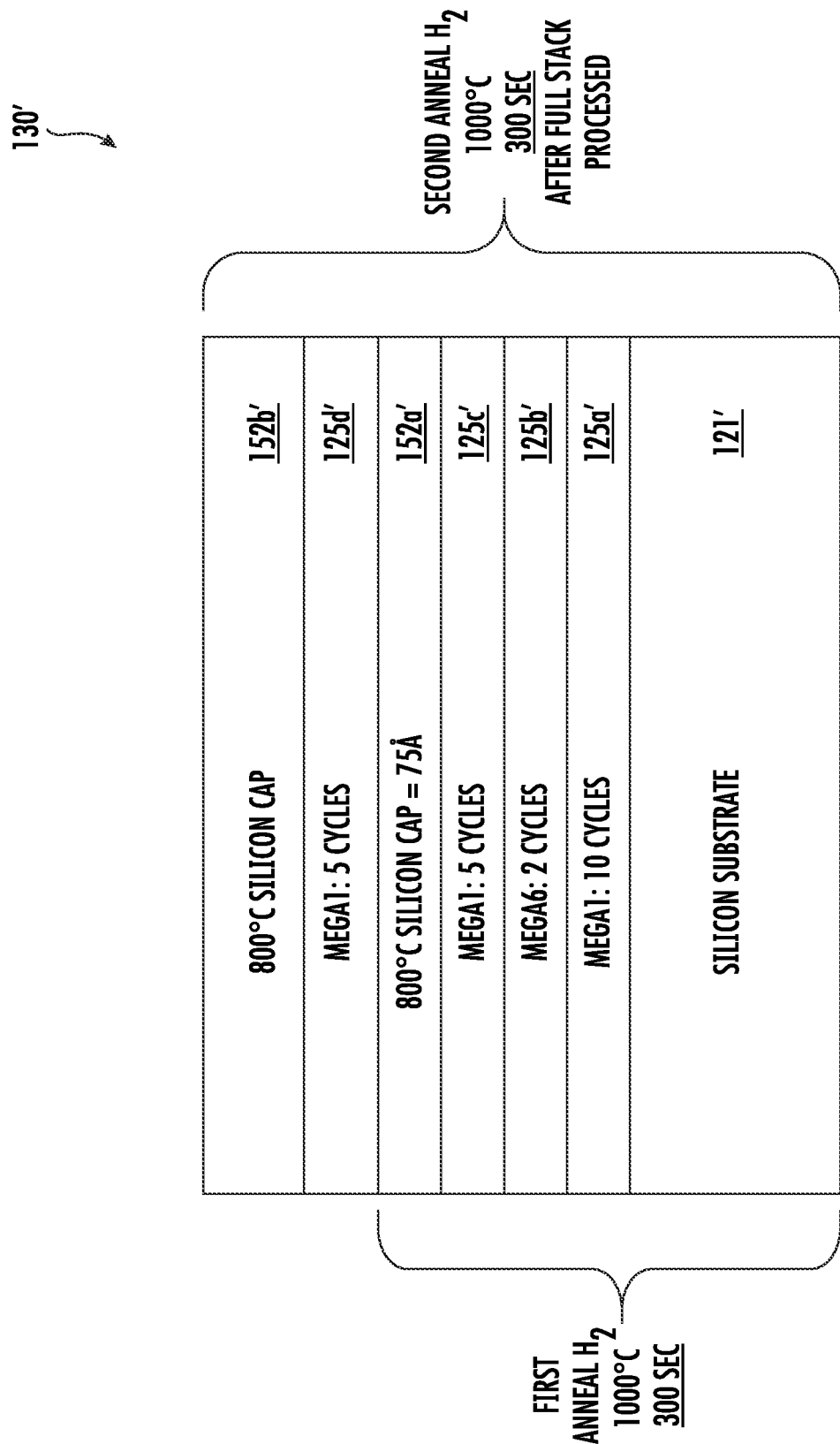
FIG. 7 is a schematic block diagram illustrating an example implementation of the approach of FIG. 5 including superlattice annealing and etching to accumulate non-semiconductor atoms.
Figure 8:
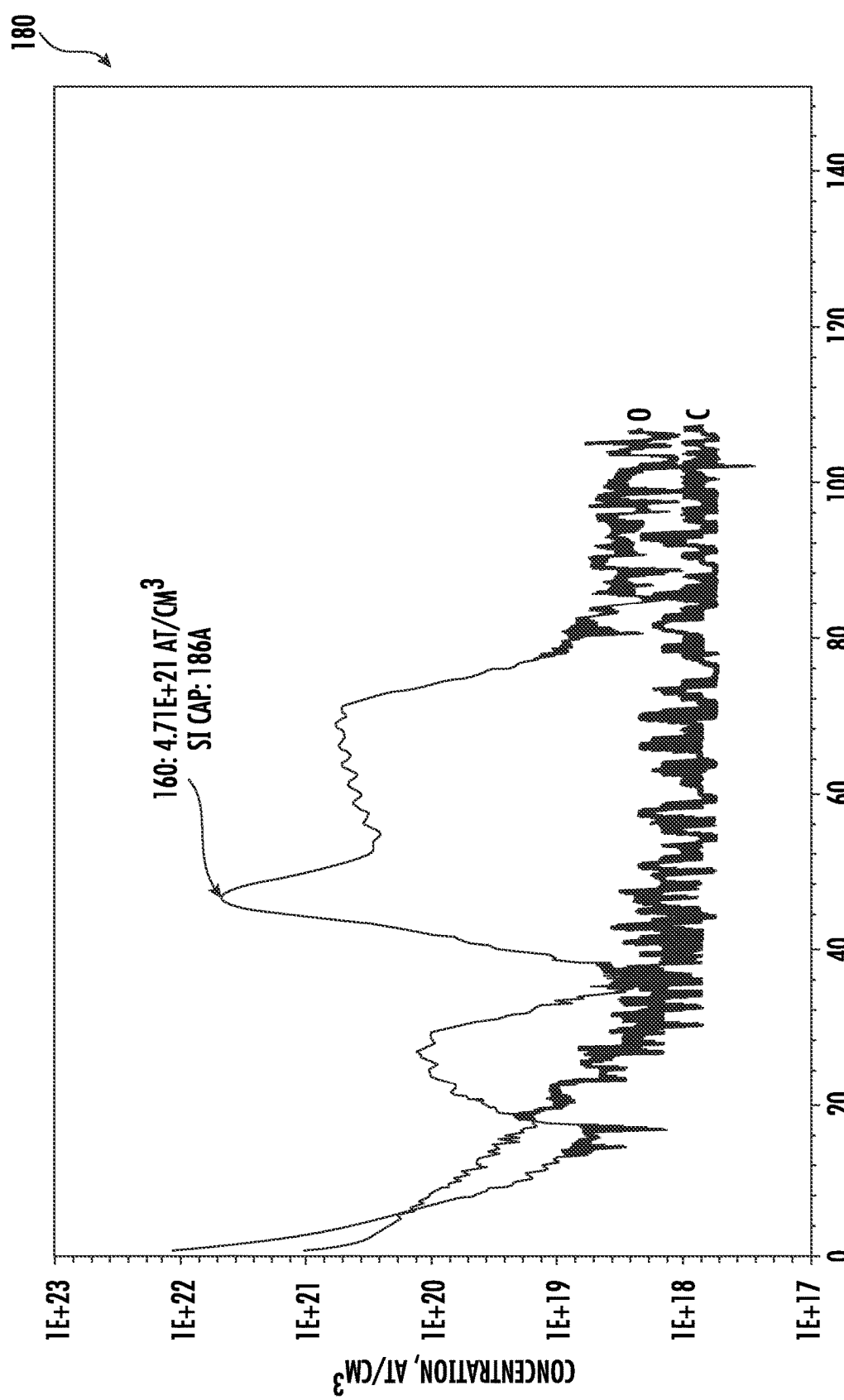
FIGS. 8 and 9 are graphs of atom accumulation vs. depth for the configuration of FIG. 7 before and after etching to accumulate non-semiconductor atoms.
Figure 9:
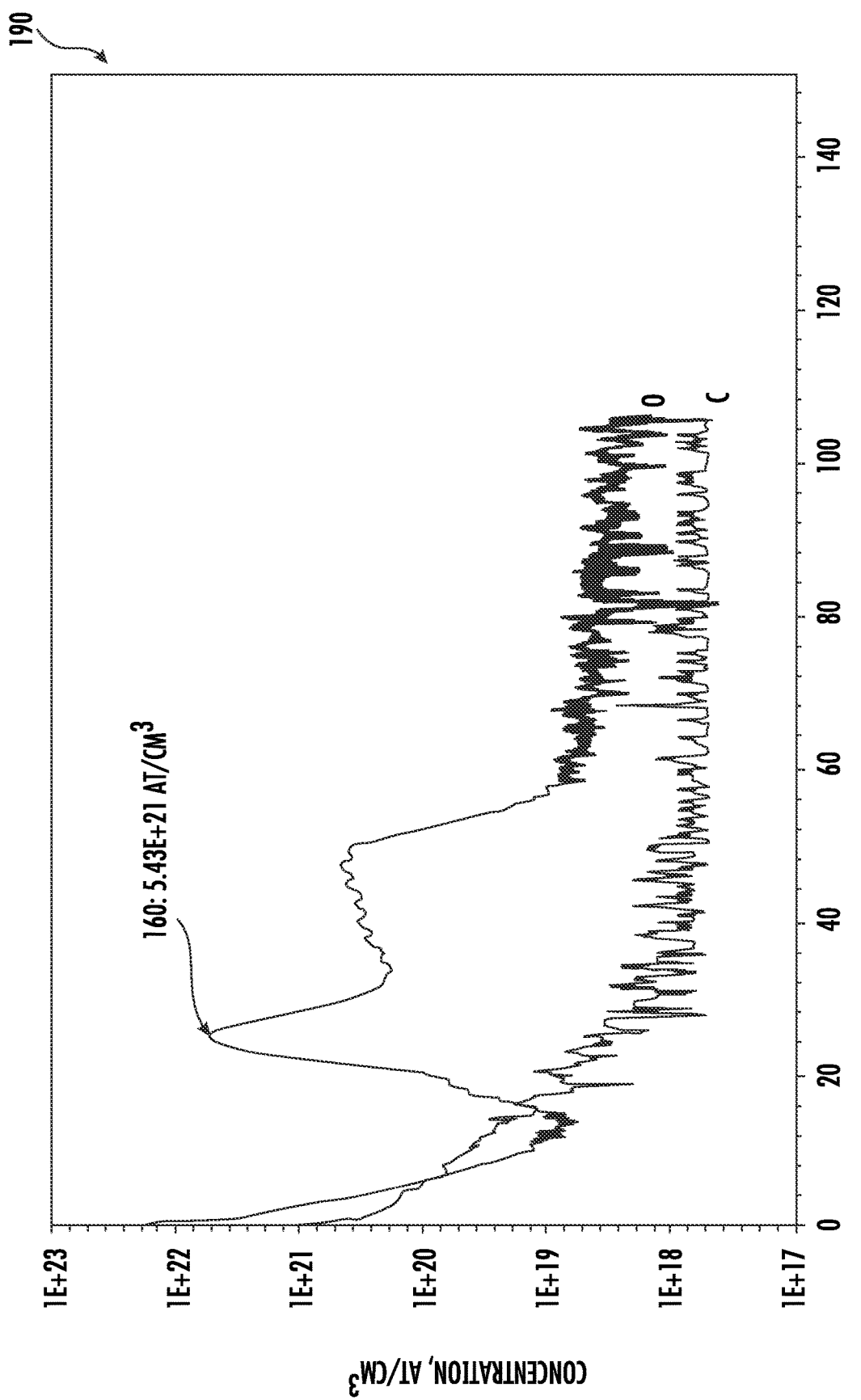

Referring additionally to FIG. 7 and the graphs 180 and 190 of FIGS. 8 and 9, an example implementation is now described in which the above-noted bulldozing approach was applied to a test structure 130' in which MST layers of different thermal stabilities (i.e., with respect to thermal stability of the non-semiconductor material) were heated to cause non-semiconductor atoms from less thermally stable Si/O superlattices to migrate toward a more thermally stable Si/O superlattice. In the present example, a first "less stable" superlattice layer 125a' is deposited on the substrate 121', followed by the second "more stable" superlattice layer 125b' and then the second "less stable" superlattice 125c'. A cap layer 152a' was formed on the second stable superlattice 125c', and a first $H_2$ anneal of this intermediate structure was performed at a temperature of 1000° C. for 300 seconds (although other anneal environments and parameters may be used in difference embodiments).

Furthermore, another less stable Si/O superlattice 125d' was then formed on the cap layer 152a', followed by another cap layer 152b'. A second $H_2$ anneal was then performed on the entire structure 130', also at a temperature of 1000° C. for 300 seconds. Heating from the anneals causes non-semiconductor atoms from the superlattices 125a', 125c' to migrate toward the non-semiconductor monolayer(s) of the superlattice 125b'. The result of having the different types of thermally stable superlattices 125a'-125d' and the anneals results in an oxygen accumulation 181 located at approximately 45 nm from the upper surface of the cap layer 152b', as seen in FIG. 8. The process of heating superlattices of different thermal stabilities to concentrate non-semiconductor atoms in a desired location (also referred to as "ASED" processing herein) is described further in co-pending U.S. application Ser. No. 17/305,192, which is also assigned to the present Applicant and is hereby incorporated herein in its entirety by reference.

Also in the present example, different film recipes or configurations were used for different MST layers. For example, these may correspond to different numbers of repeating groups of layers, different numbers of semiconductor monolayers in the groups (e.g., 2/1, 5/1, 10/1, etc.), and in some cases different types of semiconductor and/or non-semiconductor materials may be used in the different MST layers. Moreover, in the present example etch-back processing was used to fabricate the MST films with reduced defects. Further details on this etch-back process are set forth in U.S. Pat. Nos. 10,566,191 and 10,811,498, which are assigned to the present Applicant and are hereby incorporated herein in their entireties by reference. In FIG. 7, MST films formed using this etch-back process are referred to as "MEGA" MST layers. However, while ASED and MEGA processing were used in the present example, they need not be used in all embodiments with non-semiconductor bulldozing. The illustrated MEGA1 films are a low temperature MST film formed at 530° C. with inserted oxygen monolayers 50. In this configuration, the oxygen within the MEGA1 MST films 125a', 125c' is less stable and more easily transported to the MEGA6 MST layer 125b' layers during anneals. The MEGA6 MST layer 125b' includes silicon spacers formed at 685° C., allowing oxygen to stabilize in platelets, which are more thermally stable and provide a sink for oxygen pile up.

After the second thermal anneal was performed to concentrate oxygen atoms as noted above, a 120 second bulldozing etch was performed using a thermal etch (chemical vapor HCl etch) which resulted in 170A of silicon removal, the results of which are shown in the graph 190. In particular, a total oxygen dose of $2.88 \times 10$ at/cm$^2$ was used, and the oxygen accumulation 181 which was at $4.71 \times 10^{21}$ atoms/cm$^3$ after ASED processing increased to $5.43 \times 10^{21}$ atoms/cm$^3$ as a result of the bulldozing etch, as shown in the graph 190. Yet, despite no further oxygen dosage being applied, the oxygen interfacial accumulation 181 increased by approximately fifteen percent solely by adding the thermal bulldozing etch following ASED processing. It was also observed that the top oxygen donor layers were completely bulldozed into the lower MST layer 125b'.

Accordingly, if the etch time is extended for a long enough duration, then the oxygen peak 181 would increase to the point where the accumulated oxygen defines an etch stop layer that will stop the etch (or subsequent etches performed during later processing) completely. As will be appreciated by those skilled in the art, HCl exhibits selectivity to dielectrics such as $SiO_2$ and $Si_3N_4$, and it has an affinity to remove/react with silicon atoms from the surface faster than oxygen. This allows most of the oxygen atoms to condensate/remain in the underlying epitaxial growth. Moreover, the bulldozing approach may be used to ensure that the final structure is just the ASED MST layer 125b'. In this application, the layers above the ASED MST layer 125b' serve as sacrificial oxygen donor layers.

The above-described example utilized a thermal HCl etch to perform bulldozing, i.e., the pushing and piling up of non-semiconductor atoms (e.g., oxygen, carbon, nitrogen, boron, sulfur, phosphorus, selenium, etc.), as semiconductor atoms (e.g., silicon, germanium, etc.) are etched away at a higher rate than then dopants/alloyed atoms. In other example embodiments, bulldozing may be performed using plasma, thermal, or wet etching. In some cases, the end goal is that that silicon (or an alloy thereof such as SiGe, SiGeSn, etc.) grown or deposited on top of an MST layer is removed with an etch, and when the etch comes in contact with the MST layers the oxygen or other alloy atom will be pushed and piled up until a critical accumulation is reached that stops the etch all together. In the alternative, it may have significant etch selectivity such that the etch stop layer etches much slower as compared to the silicon capping layer.

Plasma etch may be performed using a process chamber that produces a local or remote plasma. These etches are often referred to as reactive ion etching (RIE), or chemical etching. Sirconi™ and Previum™ are examples of chemical plasma etches where the precursors are ionized and then either reacted directly with the surface that is to be etched, or mixed with another ionized precursor to form an etchant. One example of the latter would be the ionization of $NF_3$ and then mixing the gas stream with $NH_3$ to form ammonium bifluoride ($NH_4HF_2$) or ammonium fluoride ($NH_4F$) to selectively etch silicon dioxide using a remote plasma. Etch selectivity of $SiO_2$/epitaxial silicon approaches infinity.

There are many plasma etch precursors, of which $SF_6$, $CF_4$ are common. Plasma etch power may be used to adjust the etch selectivity of the plasma. To achieve improved etch selectivity with such chemistries the plasma power and frequency may be optimized, such as by reducing the silicon etch rate by reducing plasma power.

Mixtures of hydrogen, bromine, chlorine, and in some cases oxygen in plasma etching have also been shown to have great etch selectivity to silicon dioxide, silicon nitride, and silicon carbide while having high silicon etch rates. Etch selectivity of these plasma etches may be adjusted using plasma power and ion precursor ratios. For example, at high plasma power (KW) the etch is more driven like a plasma ion etch and may be used to remove a native oxide from the surface of the silicon substrate. At lower bias, these hydrogen, bromine, and chlorine etch chemistries become more chemical. Cl$_2$/HBr etches are an established standard used in the semiconductor industry to etch silicon and stop on gate oxide, as they have nearly infinite selectivity to silicon oxide.

In addition to Cl$_2$/HBr not etching silicon oxide, it also has nearly infinite selectivity to carbon. If one were to deposit an MST film including carbon monolayers and then start etching it with a Cl$_2$/HBr plasma etch, the carbon and/or oxygen in the MST film would be bulldozed until a full monolayer of carbon and oxygen was formed to define an etch stop with nearly infinite selectivity. The chemical nature of the Cl$_2$/HBr plasma drives the selectivity. Si—C and Si—O bonds are stronger than Si—Si bonds. In some cases, O$_2$ may be added to the gas stream. The following table provides a summary of example etches that may be used for common materials in certain bulldozing applications.

| Material Being Etched | Chemistry | Etch Gases |
|---|---|---|
| Deep Si trench | F based | HBr/NF$_3$/O$_2$/SF$_6$ |
| Shallow Si trench | Cl based | HBr/Cl$_2$/O$_2$ |
| SiO$_2$ | F based | CF$_4$/O$_2$, CF$_4$/CHF$_3$/Ar, C$_2$F$_6$, C$_3$F$_8$, C$_4$F$_8$/CO, C$_5$F$_8$, CH$_2$F$_2$ |

With respect to wet etching, tetramethylammonium hydroxide, or N(CH$_3$)$_4$OH, also known as TMAH, is a good example of a chemical used in wet etching of silicon in the semiconductor industry. This type of etch, or any other etchant that will etch silicon but not oxide and nitrides, may be used for bulldozing MST oxygen until the oxygen content stops the etching, if desired. As with the thermal and plasma etches, the etch rate is important. The TMAH-to-H$_2$O ratio may be optimized to adjust the etch rate and selectivity. Etch temperature also plays a role in selectivity, as will be appreciated by those skilled in the art.

KOH may be used in some embodiments, such as for etch stop layers for micro-electromechanical (MEMS) devices, but care should be taken for advanced semiconductor applications as the potassium may be a contaminant. EDP, HNA (HF, Nitric, and acetic acid), and BOE are other examples. All of these wet etchants show selectivity to etching silicon over dielectrics. Using these at the appropriate etch rate, they would bulldoze the oxygen until an etch barrier is formed.

Figure 10:
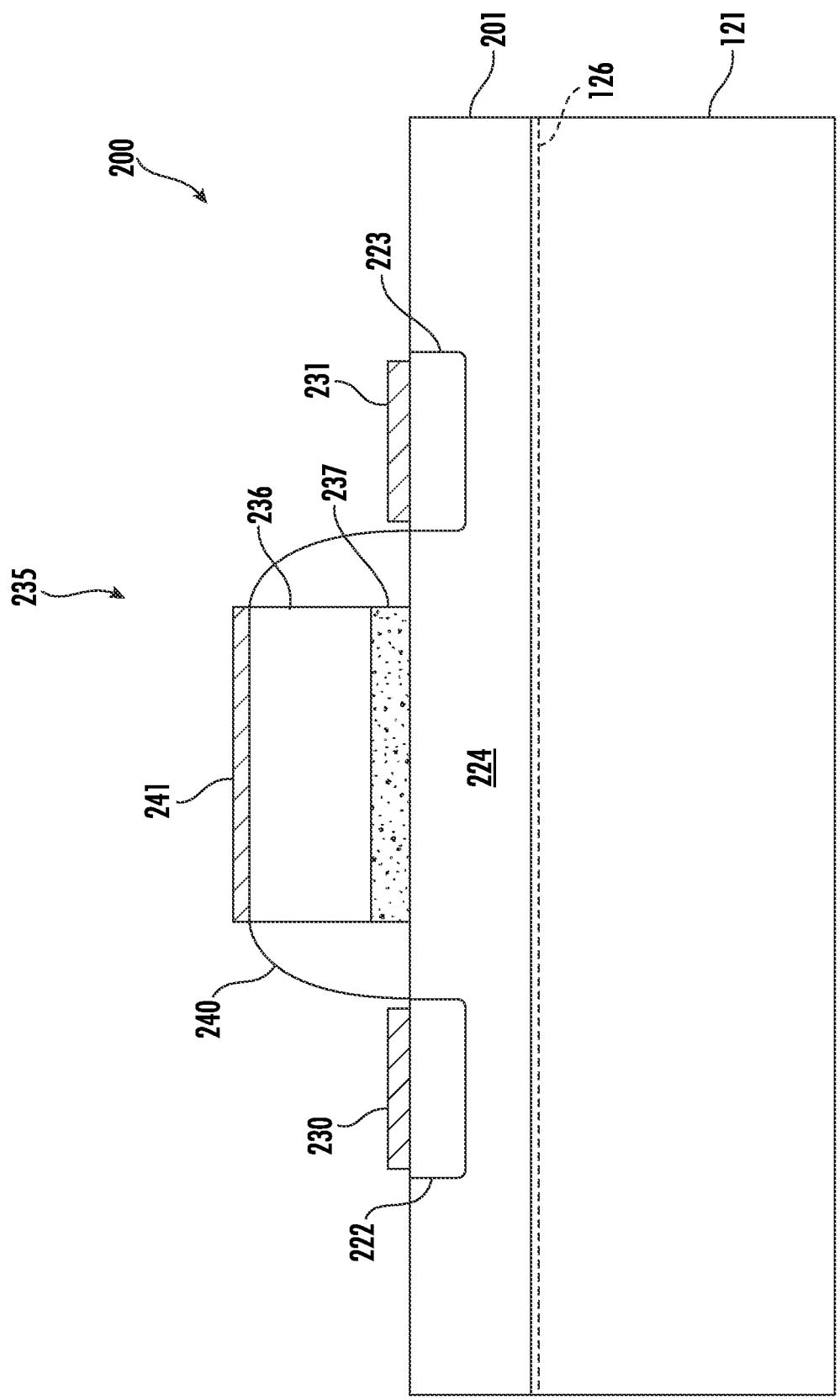
FIGS. 10 and 11 are schematic block diagrams of semiconductor devices formed using the approach of FIG. 5.

Referring additionally to FIG. 10, in some embodiments after bulldozing is performed to define the etch stop layer 126, further processing may be performed to provide a semiconductor device (MOSFET) 200. In the illustrated example, an active semiconductor (e.g., silicon with doped regions therein) layer 201 is epitaxially grown above the etch stop layer 126 (Block 105 of FIG. 5). That is, in this configuration the accumulation of non-semiconductor atoms in the etch stop layer 126 is still low enough to allow the population of Si—Si bonds across the etch stop layer, such that the crystalline structure of the underlying Si may be continued up into the active semiconductor layer 201 in which semiconductor circuits (here a MOSFET) may be formed (Block 106), which illustratively concludes the method of FIG. 5 (Block 107).

Figure 11:
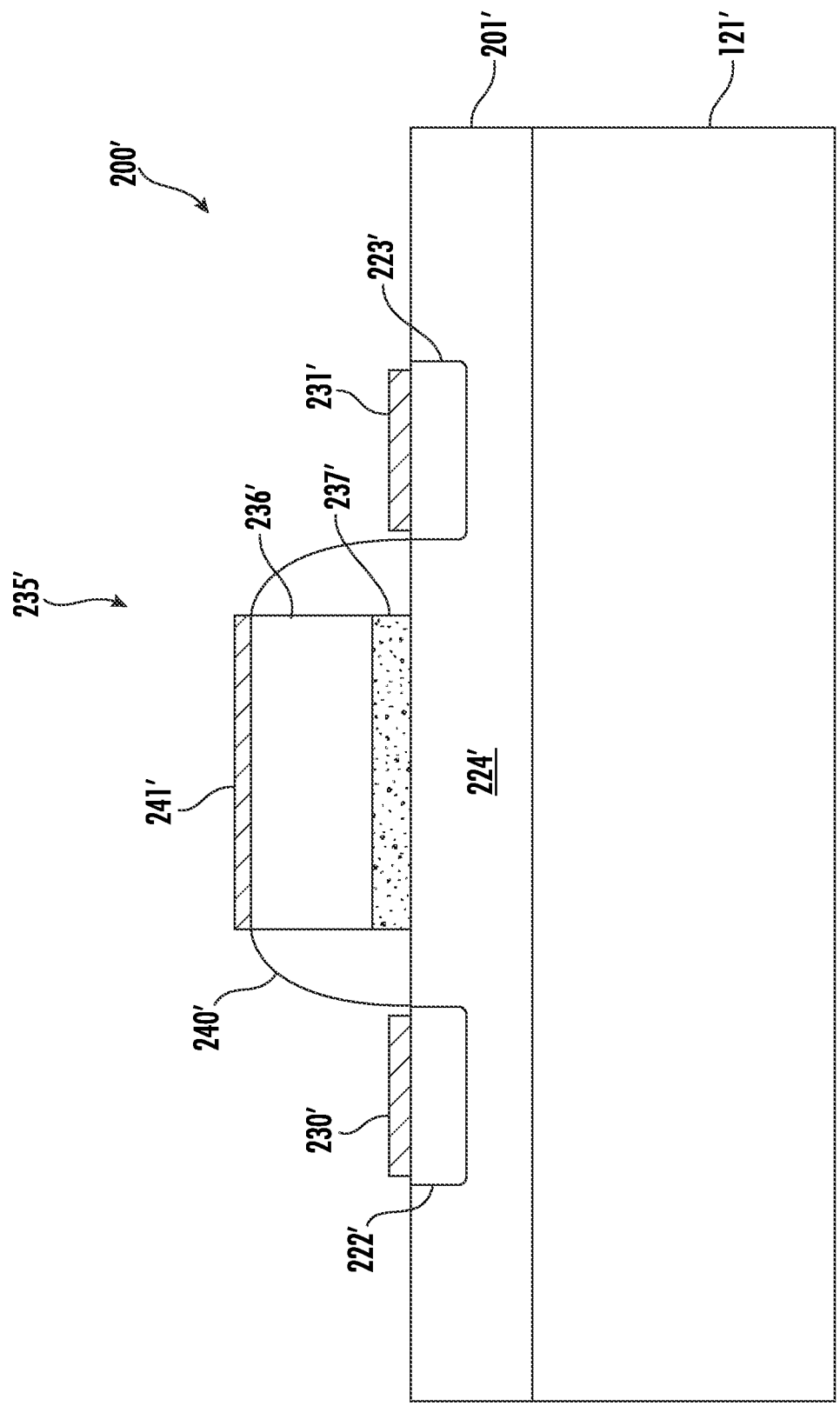

More particularly, the illustrated MOSFET 200 includes source/drain regions 222, 223 defining a channel region therebetween. In some embodiments, an MST layer may be formed in the channel region, if desired. Moreover, in configurations such as the structure 130', there may be one or more MST layers underneath the etch stop layer 126. Source/drain contacts 232, 233 overlie the source/drain regions 222, 223. A gate 235 illustratively includes a gate insulating layer 237 over the channel region, and a gate electrode layer 236 on the gate insulating layer. Sidewall spacers 240 are also provided in the illustrated MOSFET 200, along with a gate contact layer 241. Other semiconductor circuits and devices (e.g., FINFETs, MEMS devices, etc.) may also or instead be formed in the active semiconductor layer 201 in different embodiments. Other applications for the above-described bulldozing approach may include the formation of SOI wafers with circuits using a flip-chip process, where the etch stop layer is used to prevent etching down into the circuitry after wafer bonding. Moreover, in some embodiments, the accumulated non-semiconductor atoms of the layer 261 may be removed (e.g., with an HF etch) before further device processing, such as in the embodiment of the MOSFET 200' shown in FIG. 11.

Further details regarding the above-described configurations are provided in co-pending application bearing Ser. No. 17/452,604 and filed Oct. 28, 2021, which is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A method for making a semiconductor device comprising:
    forming a superlattice above a semiconductor layer, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions; and
    selectively etching the superlattice to remove semiconductor atoms and cause non-semiconductor atoms to accumulate and define an etch stop layer.

2. The method of claim 1 further comprising epitaxially growing an active semiconductor layer above the etch stop layer.

3. The method of claim 1 further comprising removing the etch stop layer.

4. The method of claim 1 further comprising forming at least one other superlattice between the semiconductor layer and the superlattice layer, the at least one other superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

5. The method of claim 1 wherein selectively etching comprises chemical etching.

6. The method of claim 1 wherein selectively etching comprises plasma etching.

7. The method of claim 1 wherein the at least one non-semiconductor monolayer comprises a non-semiconductor selected from the group consisting of oxygen, nitrogen, fluorine, carbon and carbon-oxygen.

8. The method of claim 1 wherein the base semiconductor layers comprise silicon.

9. The method of claim 1 wherein the etch stop layer comprises at least one full monolayer of non-semiconductor atoms.

10. A method for making a semiconductor device comprising:
   forming first and second superlattices above a semiconductor layer, the first and second superlattices each comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
   selectively etching the second superlattice to remove semiconductor atoms and cause non-semiconductor atoms to accumulate and define an etch stop layer;
   removing the etch stop layer; and
   epitaxially growing an active semiconductor layer above the first superlattice.

11. The method of claim 10 wherein selectively etching comprises chemical etching.

12. The method of claim 10 wherein selectively etching comprises plasma etching.

13. The method of claim 10 wherein the at least one non-semiconductor monolayer comprises a non-semiconductor selected from the group consisting of oxygen, nitrogen, fluorine, carbon and carbon-oxygen.

14. The method of claim 10 wherein the base semiconductor layers comprise silicon.

15. A method for making a semiconductor device comprising:
   forming a superlattice above a semiconductor layer, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions; and
   selectively etching the superlattice to remove silicon atoms and cause oxygen atoms to accumulate and define an etch stop layer.

16. The method of claim 15 further comprising epitaxially growing an active silicon layer above the etch stop layer.

17. The method of claim 15 further comprising removing the etch stop layer.

18. The method of claim 15 further comprising forming at least one other superlattice between the semiconductor layer and the superlattice layer, the at least one other superlattice comprising a plurality of stacked groups of layers, each group of layers comprising a plurality of stacked base silicon monolayers defining a base silicon portion, and at least one oxygen monolayer constrained within a crystal lattice of adjacent base silicon portions.

19. The method of claim 15 wherein selectively etching comprises chemical etching.

20. The method of claim 15 wherein selectively etching comprises plasma etching.

* * * * *